(12) United States Patent
Nian et al.

(10) Patent No.: US 11,230,784 B2
(45) Date of Patent: Jan. 25, 2022

(54) ELECTROCHEMICAL PLATING SYSTEM AND METHOD OF USING

(71) Applicant: Taiwan Semiconductor Manufacturing Co., Ltd., Hsinchu (TW)

(72) Inventors: Jun-Nan Nian, Tainan (TW); Shiu-Ko Jangjian, Tainan (TW); Ting-Chun Wang, Tainan (TW); Ing-Ju Lee, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 98 days.

(21) Appl. No.: 16/677,563

(22) Filed: Nov. 7, 2019

(65) Prior Publication Data

US 2020/0173051 A1    Jun. 4, 2020

Related U.S. Application Data

(60) Provisional application No. 62/774,100, filed on Nov. 30, 2018.

(51) Int. Cl.
*C25D 21/12*       (2006.01)
*C25D 3/38*        (2006.01)
*H01L 21/768*      (2006.01)
*C25D 7/12*        (2006.01)
*C25D 17/00*       (2006.01)

(52) U.S. Cl.
CPC ............. *C25D 7/123* (2013.01); *C25D 3/38* (2013.01); *C25D 17/001* (2013.01); *C25D 17/005* (2013.01); *C25D 21/12* (2013.01); *H01L 21/76873* (2013.01); *H01L 21/76877* (2013.01)

(58) Field of Classification Search
CPC ................................................ C25D 7/12–123
See application file for complete search history.

(56) References Cited

U.S. PATENT DOCUMENTS

| 6,638,409 | B1 | 10/2003 | Huang et al. |
| 6,808,611 | B2 | 10/2004 | Sun et al. |
| 2004/0115932 | A1* | 6/2004 | Cheng ............... C25D 17/007 438/676 |

(Continued)

FOREIGN PATENT DOCUMENTS

| CN | 102459717 A | 5/2012 |
| KR | 10-2012-0070520 A | 6/2012 |

(Continued)

*Primary Examiner* — Ho-Sung Chung
(74) *Attorney, Agent, or Firm* — Seed IP Law Group LLP (57) ABSTRACT

An electrochemical plating (ECP) system is provided. The ECP system includes an ECP cell comprising a plating solution for an ECP process, a sensor configured to in situ measure an interface resistance between a plated metal and an electrolyte in the plating solution as the ECP process continues, a plating solution supply system in fluid communication with the ECP cell and configured to supply the plating solution to the ECP cell, and a control system operably coupled to the ECP cell, the sensor and the plating solution supply system. The control system is configured to compare the interface resistance with a threshold resistance and to adjust a composition of the plating solution in response to the interface resistance being below the threshold resistance.

20 Claims, 7 Drawing Sheets

(56) References Cited

U.S. PATENT DOCUMENTS

2012/0234683 A1   9/2012  Lien et al.

FOREIGN PATENT DOCUMENTS

| KR | 10-2013-0060164 A | 6/2013 |
| KR | 10-2016-0113007 A | 9/2016 |
| KR | 10-2016-0132140 A | 11/2016 |
| TW | 201702436 A | 1/2017 |
| TW | 201827654 A | 8/2018 |
| WO | 2013/090295 A1 | 6/2013 |

* cited by examiner

ELECTROCHEMICAL PLATING SYSTEM AND METHOD OF USING

BACKGROUND

Integrated circuits include numerous devices such as transistors, capacitors, resistors, and diodes. These devices, which are initially isolated from one another, are interconnected together through wiring to form functional circuits. Such wiring is done through multiple metallization layers including metal lines, providing lateral electrical connection, and a plurality of vias, providing vertical electrical connection between two neighboring stacked metallization layers. The metal lines and vias are commonly referred to as interconnect structures. Interconnect structures are increasingly determining the limits of performance and the density of advanced integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Copper and copper alloys have been widely used for filling sub-micro, high aspect ratio features on semiconductor substrates. Copper and copper alloys have lower resistivity and higher electromigration resistance compared to the other metals such as, for example, aluminum. These characteristics are critical for achieving higher current densities and increased device speed. In manufacturing interconnect structures including copper, damascene technique (i.e., single damascene or dual damascene) is performed, in which a dielectric layer is first deposited over a semiconductor substrate. The dielectric layer is then patterned to form contact openings such as trenches and/or vias therein. Next, a barrier layer is laid over the dielectric layer to prevent diffusion of the subsequently applied copper into the dielectric layer, followed by physical or chemical vapor deposition of a seed layer to provide electrical conductivity for a sequential plating process. The contact openings are subsequently filled with copper or copper alloys, which are then planarized using, for example, a chemical mechanical polishing (CMP) process.

Deposition of copper in a damascene process is accomplished by an electrochemical plating (ECP) process. During electrochemical plating, the semiconductor substrate is electrically biased to serve as a cathode. The semiconductor substrate with the patterned dielectric layer is immersed into a plating solution containing copper ions. The copper ions are reduced at the surface of the seed layer to form electrodeposited copper. The ECP process continues until the contact openings are filled with copper.

In addition to inorganic constituents in the form of copper salts, the plating solution contains organic additives such as suppressor, accelerator, and leveler for achieving desired deposition properties. One of the key functions of the organic additives is to ensure the ECP process fills the contact openings, in a direction from bottom to top, to avoid formation of pin holes or voids that degrade device performance and reliability. When used in appropriate concentrations, these organic additives enable void-free metal filling through accelerating copper deposition at the bottoms of the contact openings and suppressing copper deposition on the upper corners of the contact openings.

Circuit components are not uniformly distributed on a semiconductor substrate, and the densities of metal lines in a metallization layer across the semiconductor substrate are thus different. For example, in one chip region which has a relatively high device density, dense metal lines are present due to a higher device density requiring a larger number of electrical connections, while in another chip region with a relatively low device density, the density of the metal lines is also low because a lower device density requires a smaller number of electrical connections. Metal lines in a higher density region possess a higher line-end density, while metal lines in a lower density region possess a lower line-end density.

Line-end densities influence gap filling behavior of metal during the ECP process. During plating, the local current density in a lower line-end density region is higher than the local current density in a higher line-end density region since the overall plating current to the semiconductor substrate is fixed. The relative low current density in the higher line-end density region leads to a relative slow bottom-up growth rate. As a metal such as copper is deposited, copper tends to be built up more easily at the entrance of the contact openings in the higher line-end density region if the bottom-up growth rate is not fast enough. The "build-up" or "overhang" blocks the path for the copper deposition and often results in voids formation in the contact openings in the higher line-end density region. Voids often cause the failure of metal lines, and reduce the reliability of the integrated circuits.

Good (i.e., void-free) metal filling has been observed when atomic ratio of carbon and copper in the electroplated copper is greater than 5%. However, a consequence of the ECP operation is the degradation of the organic additives over time. As organic additives degrade, the resistance at the plating interface, i.e., the interface between the plated metal and the electrolyte in the plating solution, tends to decrease, which leads to an increase in the copper plating rate. As the resistance at the plating surface is increased to a certain value, the overhang starts to occur in a region where the contact openings have the highest line-end density. However, in some approaches, the overhang of the electroplated copper at the entrance of the contact openings is not able to be caught in real time. The voids in the electroplated copper can only be found after a batch of semiconductor wafers have been processed using the ECP process. The production yield is hence adversely affected.

In some embodiments, an electrochemical plating (ECP) system that is capable of in situ monitoring the interface resistance between the plated metal and the electrolyte in the plating solution as the ECP process continues is provided. The value of the interface resistance is compared with a threshold resistance value below which voids start to occur in metal lines having the highest line-end density for a specific metallization layer. Once the value of the interface resistance is observed to be below the threshold resistance value, the ECP system adjusts the amount of the organic additives in the plating solution to maintain the interface resistance in a range that produces void-free electroplated metal in contact openings with different line-end densities across the substrate. The ECP system of the present disclosure thus helps to prevent formation of voids in interconnect structures and to improve reliability of integrated circuits.

Figure 1:
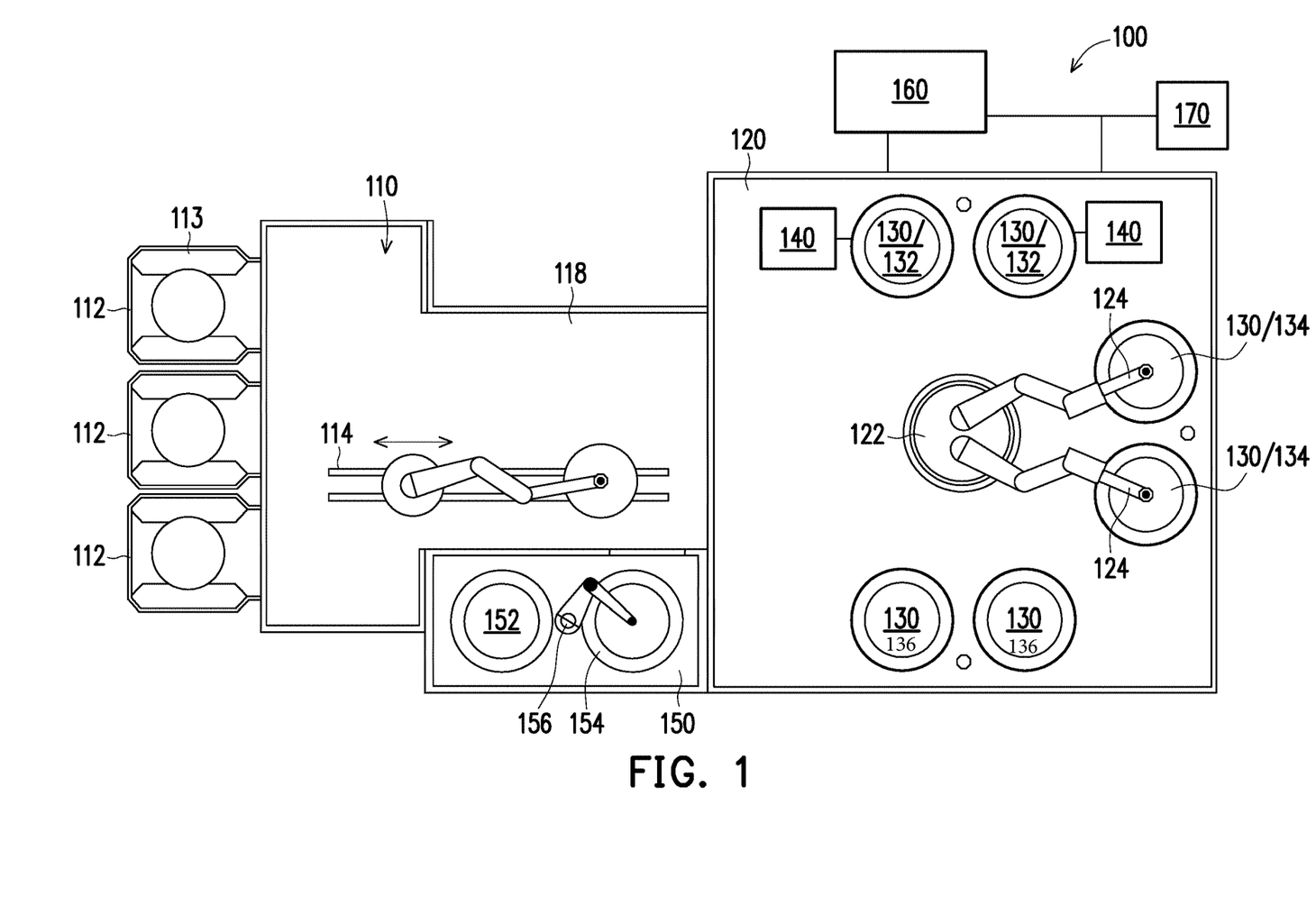
FIG. 1 is a plan view of an electrochemical plating (ECP) system, in accordance with some embodiments.

FIG. 1 is a top plan view of an ECP system 100, in accordance with some embodiments.

Referring to FIG. 1, the ECP system 100 includes a factory interface 110, a processing mainframe 120, an anneal chamber 150, a plating solution supply system 160 and a control system 170. The processing mainframe 120 and the anneal chamber 150 are in communication with the factory interface 110.

The factory interface 110 includes a plurality of substrate loading stations 112 configured to interface with and retain substrate-containing cassettes 113. A factory interface robot 114 is positioned in the factory interface 110 and is configured to access and transfer a substrate into and out of cassettes 113 on the substrate loading stations 112. The factory interface robot 114 also extends into a link tunnel 118 that connects the factory interface 110 to the processing mainframe 120. The position of the factory interface robot 114 allows the robot to access to the substrate loading stations 112 to retrieve a substrate from one of the cassettes 113 on the substrate loading stations 112 and then deliver the substrate to the processing mainframe 120. Additionally, the factory interface robot 114 is operable to transfer a substrate into or out of the anneal chamber 150. Furthermore, after an ECP processing sequence is completed, the factory interface robot 114 is operated to return the substrate to one of the cassettes 113 positioned on the substrate loading stations 112 for removal from the ECP system 100.

The processing mainframe 120 includes a mainframe robot 122 and a plurality of processing cells 130 positioned on the processing mainframe 120. The mainframe robot 122 includes one or more robot blades 124 configured to support and transfer the substrates. Additionally, the mainframe robot 122 and robot blades 124 are configured to independently extend, rotate, pivot, and vertically move so that the mainframe robot 122 is capable of simultaneously inserting and removing substrates to/from the plurality of processing cells 130. In some embodiments, the mainframe robot 122 is a flipper robot that facilitates transfer of a substrate from a face-up position on the robot blade 124 of the mainframe robot 122 to a face down position for a processing cell 130 that requires face-down processing of substrate.

The processing cells 130 are configured to be utilized in an ECP process, for example, as ECP cells, rinsing cells, substrate bevel clean cells, spin rinse dry cells, substrate surface cleaning cells, and other cells that are used in conjunction with a plating platform. In some embodiments, the processing cells 130 include one or more ECP cells 132, one or more spin rinse dry (SRD) cells 134, and one or more substrate bevel cleaning cells 136. Although in the illustrated embodiment of FIG. 1, two processing cells 130 are configured as ECP cells 132, it will be understood that the number of ECP cells 132 is not so limited, and any number of ECP cells 132 are contemplated. The ECP cells 132 are further described below with respect to FIG. 2.

Each of the ECP cells 132 is coupled to a sensor 140. Each sensor 140 is adapted to in situ measure interface resistance between the plated metal and the electrolyte in the plating solution in a corresponding ECP cell 132 as the ECP process continues. The in situ measured interface resistance is compared with a threshold resistance and once the value of the interface resistance is less than the threshold resistance value, the concentration of the organic additives in the plating solution (e.g., plating solution 230 in FIG. 2) is adjusted to increase the interface resistance, thereby reducing the metal deposition rate at the entrance of the contact openings. The sensor 140 thus helps to obtain void-free electroplated metal for metal lines with different line-end densities for a given metallization layer across the substrate. The sensors 140 are further described below with respect to FIG. 2.

The anneal chamber 150 is adapted to anneal the electroplated metal film after the ECP process. The annealing helps to increase the grain size, evolve impurities, and reduce the resistance of resulting metal lines. The annealing also help to stabilize the microstructure to ensure that the subsequently performed CMP removal rate is reproducible. In some embodiments, the anneal chamber 150 is a two-position annealing chamber including a cooling plate 152 and a heating plate 154 positioned adjacent to the cooling plate 152. A substrate transfer robot 156 is positioned between the cooling plate 152 and the heating plate 154. The substrate transfer robot 156 is configured to move a substrate between the cooling plate 152 and the heating plate 154.

The plating solution supply system 160 is individually connected to the ECP cells 132 and is configured to circulate the plating solution through the ECP cells 132 during the ECP process. Additionally, the SRD cells 134 and substrate bevel cleaning cells 136 are also in communication with a fluid delivery system (not shown) configured to supply the necessary cleaning fluids to the respective cells 134 and 136 during the ECP process. In some embodiments, the fluid delivery system can also be used to supply the plating solution to ECP cells 132.

Components in the ECP system 100 are in communication with a control system 170. The control system 170 is configured to receive from both a user and/or various sensors in the ECP system 100 and to control operation of the ECP system 100 in accordance with the inputs and/or a predetermined processing recipe.

Figure 2:
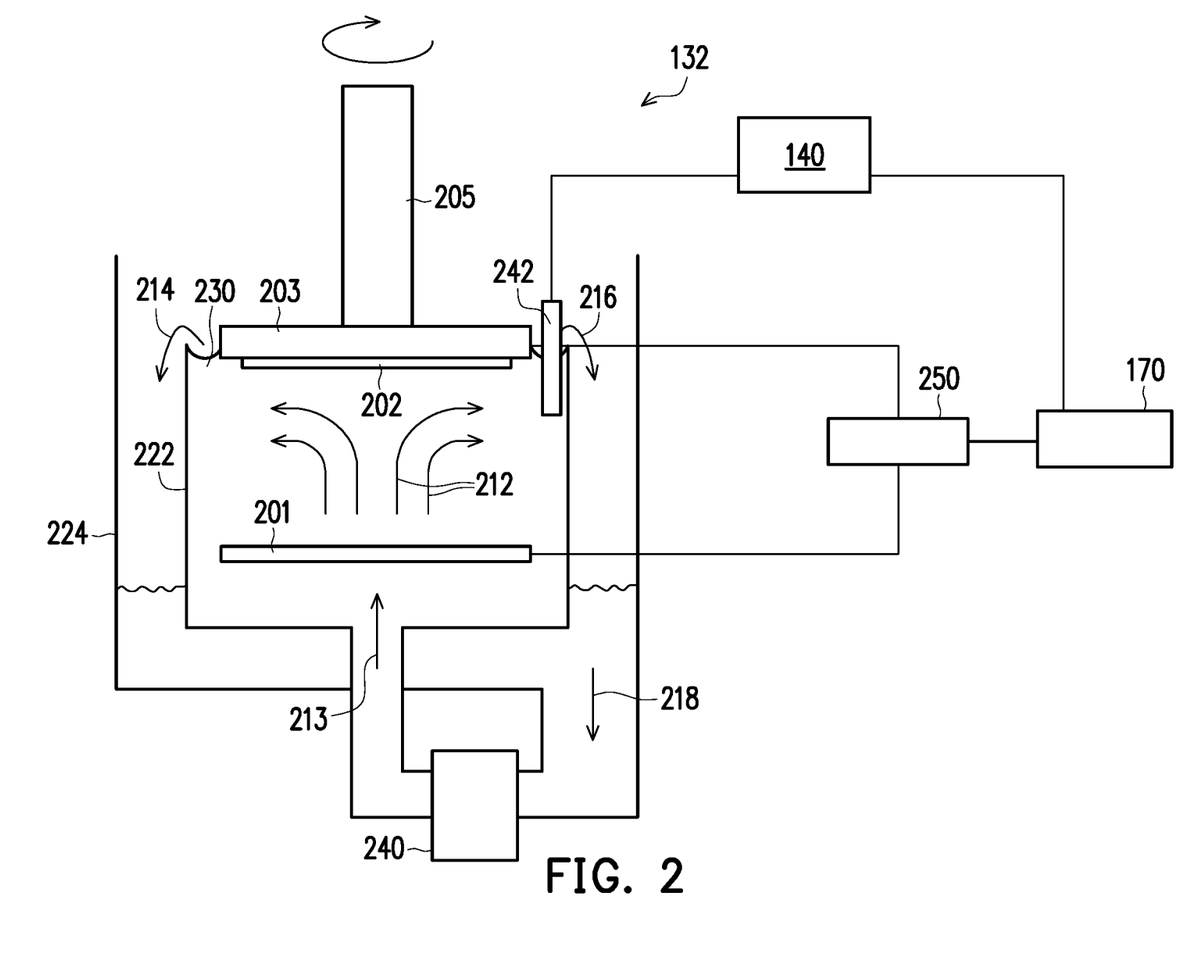
FIG. 2 is a schematic view of an ECP cell and a sensor in the ECP system, in accordance with some embodiments.

FIG. 2 is a schematic diagram of an ECP cell 132 and a sensor 140 in an ECP system, e.g., ECP system 100, in accordance with some embodiments.

Referring to FIG. 2, the ECP cell 132 includes an anode 201, a substrate holder 203 mounted on a rotatable spindle 205, a power supply 250 coupled to the anode 201 and the substrate holder 203, and a plating bath 222. The power supply 250 is coupled to the control system 170. The plating bath 222 contains a plating solution 230, and the anode 201 is disposed within the plating solution 230. In some embodiments, the anode 201 includes a source of a metal (e.g., copper) that is to be plated onto the substrate 202.

During an electrochemical plating cycle, a substrate 202 is mounted in the substrate holder 203, which is then placed in the plating bath 222. As indicated by arrows 212 and 213, the plating solution 230 is continually applied to the plating bath 222 by a pump 240. Generally, the plating solution 230 flows upwards to the center of the substrate 202 and then flows radially outward and across the substrate 202. The plating solution 230 then flows from the plating bath 222 to an overflow reservoir 224 as indicated by arrows 214 and 216. The plating solution 230 is then be filtered (not shown) and returned to the pump 240 as indicated by arrow 218, completing recirculation. The power supply 250, such as a DC power supply, has a negative output lead electrically connected to the substrate 202 via the substrate holder 203. The positive output lead of power supply 250 is electrically connected to the anode 201 located in plating bath 222. During the ECP process, the power supply 250 biases the substrate 202 to provide a negative potential relative to the anode 201 generating electrical current from the anode 201 to the substrate 202. Electrical current flows in the same direction as the net positive ion flux and opposite to the net electron flux. This causes an electrochemical reaction (e.g., $Cu^{2+}+2e=Cu$) on the substrate 202 which results in deposition of metal (e.g., copper) thereon. The ion concentration of the plating solution 230 is replenished during the plating cycle, e.g., by dissolution of the anode 201 (e.g., $Cu=Cu^{2+}+2e$).

The plating solution 230 includes a metal salt containing ions of the metal to be electroplated on the substrate 202. In instances where the metal that is to be electroplated onto the substrate 202 is copper, the anode 201 is made of copper, and the plating solution 230 includes a mixture of copper salt, acid, water and various organic and inorganic additives that improve the properties of the deposited copper. Examples of copper salts in the plating solution 230 include, but are not limited to, copper sulfate, copper cyanide, copper sulfamate, copper chloride, copper fluoride, copper nitrate, copper oxide, copper fluoroborate, copper trifluoroacetate, copper pyrophosphate, and copper methane sulfonate, and hydrates of any of the foregoing compounds. The concentration of the copper salt used in the plating solution 230 varies depending on the particular copper salt used. Examples of acids used in the electroplating solution include, but are not limited to, sulfuric acid, methane sulfonic acid, fluoroboric acid, hydrochloric acid, hydroiodic acid, nitric acid, and phosphoric acid. The concentration of the acid used in the plating solution 230 varies depending on the particular acid used.

The plating solution 230 further comprises organic additives that improve electroplating characteristics of the metal. The organic additives help to eliminate void formation by suppressing the electrodeposition rate at protruding areas in the surface of the substrate 202 and/or by accelerating the electrodeposition rate in recessed areas in the surface of the substrate 202. Organic additives employed in a copper plating solution include suppressors, accelerators, and levelers. Suppressors are macromolecule deposition inhibitors that tend to adsorb over the surface of the substrate 202 and reduce local deposition rates, increasing the deposition uniformity. Examples of suppressors include, but are not limited to, polyethers, such a polyethylene glycol, and other polymers such as polypropylene oxide. Accelerators are organic molecules that tend to counter the suppressive effect of the suppressors and provide accelerated deposition within substrate recesses. Examples of accelerators include, but are not limited to, organic sulfide compounds, such as bis (sodium sulfopropyl)-disulfide, 3-mercapto-1-propane sulfonic acid sodium salt, N-dimethyl-dithiocarbamyl propylsulfonic acid sodium salt, and 3-S-isothiuronium propyl sulfonate. Levelers usually have ingredients with nitrogen functional group and in some instances are added to the plating solution 230 at a relatively low concentration. The leveling involves the diffusion or migration of strongly current suppressing species to corners or edges of contact openings which otherwise plate more rapidly than desired due to electric field and solution mass transfer effects. Examples of the levelers include, but are not limited to, polyether surfactants, polyethylene glycol surfactants, polyacrylic acids, polyamines, polyacrylamides, phenazine azodyes, alkoxylated amine surfactants, and polymer pyridine derivatives.

However, during the ECP process, these organic additives react with the anode. The reaction causes the organic additives to decompose, which renders the organic additive ineffective. As such, the concentration of the organic additives in the plating solution is reduced as a result of consumption in the plating process. The interface resistance thus is gradually reduced over time. Once the interface resistance is reduced to a value that is below a threshold resistance value, overhang and the resulting voids start to generate in the electroplated copper in contact openings having the highest line-end density due to the increase of the copper plating rate at the corners of the contact openings. To help to form void-free electroplated metal fill across the substrate 202, the interface resistance between the plated metal and the electrolyte in the plating solution is in situ measured using the sensor 140 as the ECP process continues to determine when overhang starts to occur at the corners of the contact openings having the highest line-end density, and to adjust the amount of organic additives in the plating solution, before voids are formed.

The sensor 140 is disposed outside the ECP cell 132. In some embodiments, the sensor 140 is an ohmmeter. In some embodiments, the sensor 140 is an impedance meter. The sensor 140 includes a sensor probe 242 adapted to be partially immersed in the plating solution 230. The sensor probe 242 is in contact with the plating solution 230 to in situ measure the interface resistance between the plated metal and the electrolyte in the plating solution 230. In some embodiments, the sensor probe 242 is made of a metal to be electroplated on the substrate 202 or a metal to be electroplated over a noble metal. Examples of the noble metals include, but are not limited to, platinum, gold, palladium, iridium, and ruthenium. In instances where the metal that is to be electroplated onto the substrate 202 is copper, the sensor probe 242 is wires made of copper or copper plated noble metal. It should be noted that although FIG. 2 illustrates the sensor probe 242 is placed in the plating bath 222, the sensor probe 242 being placed in the overflow reservoir 224 is also contemplated.

The ECP cell 132 and the sensor 140 are in communication with the control system 170. The control system 170 is configured to output control signals to the power supply 250 or other controllable components in the ECP cell 132 to adjust the localized intensity of the electric field, thus, performing a control over the plating processes. The control system 170 is also configured to receive information from the sensor 140. In some embodiments, the control system 170 receives information related to the interface resistance from the sensor 140. Based on the interface resistance received from the sensor 140, the control system 170 is configured to compare the in-situ measured interface resistance with a threshold resistance that is associated with formation of void-free electroplated metal lines having the highest line-end density for a given metallization layer. In some embodiments, the control system 170 is configured to adjust the composition of the plating solution 230, i.e., the concentration of organic additives such as suppressors, accelerators, and levelers in the plating solution 230 once the value of the interface resistance is decreased to a value that is below the threshold resistance value.

Figure 3:
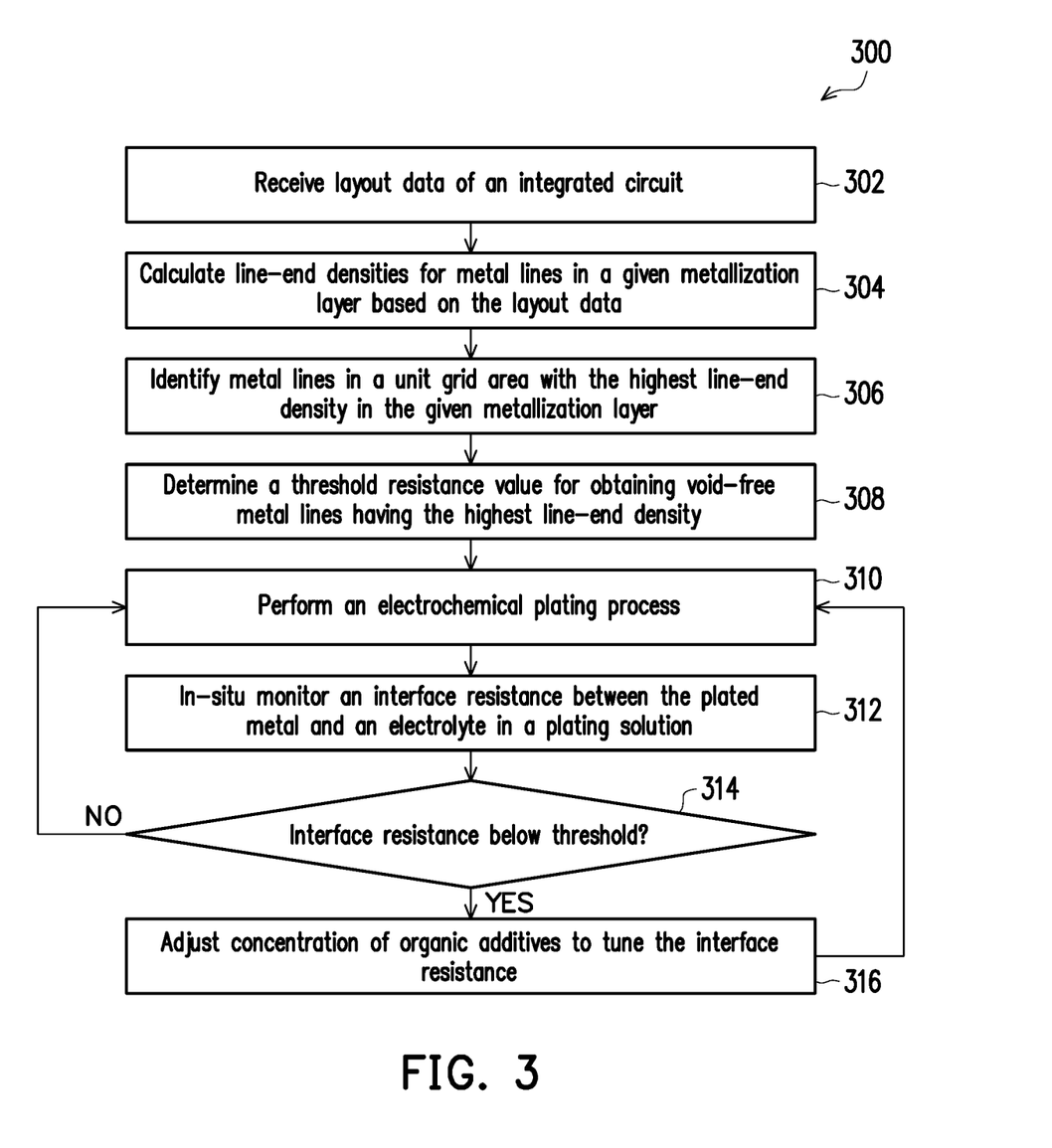
FIG. 3 is a flowchart of a method of using an ECP system, in accordance with some embodiments.

FIG. 3 is a flowchart of a method 300 of using the ECP system 100, in accordance with some embodiments.

Referring to FIG. 3, the method 300 includes operation 302, in which a layout data of an integrated circuit is received. The layout data, for a non-limiting example, is provided in GDSII format, although other formats of graphical design data for integrated circuits could be used. The layout data includes layout data for metallization layers in the integrated circuit.

In operation 304, based on the layout data, line-end densities of metal lines in a given metallization layer are calculated. For example, if the metallization layer to be evaluated is the first metallization layer that is closest to a substrate, then the layout data corresponding to the metal lines for the first metallization layer are extracted. To calculate the line-end densities, the entire substrate area is divided into a plurality of unit grid areas and line-end densities for metal lines in the unit grid areas for the given metallization layer are calculated. For each unit grid area over the substrate, the line-end density (LeD) is calculated as LeD=1/(line width+line spacing).

In operation 306, the metal lines in a unit grid area having the highest line-end density for the given metallization layer is identified.

In operation 308, a threshold resistance value at the interface of the plated metal and the electrolyte in the plating solution for obtaining void-free metal lines that have the highest line-end density is determined. In some embodiments, the threshold resistance value is determined based on empirical data related to the performance of the ECP process.

In operation 310, an ECP process is performed in an ECP system, e.g., ECP system 100 (FIGS. 1 and 2). A substrate, e.g., substrate 202, to be plated is secured to a substrate holder, e.g., substrate holder 203, and the plating surface of the substrate 202 is brought into contact with a plating solution, e.g., plating solution 230. While in contact with the plating solution, an electrical bias is applied to a seed layer deposited on the plating surface of the substrate 202. The seed layer normally includes a metal the same as the metal to be plated. The electrical bias is generally a bias configured to bias the substrate surface/metal seed layer with a cathodic charge, which causes the metal ions in the plating solution 230 to be urged out of the plating solution 230 and to be plated on the cathodically charged substrate surface/metal seed layer.

In operation 312, the interface resistance between the plated metal and the electrolyte in the plating solution is in-situ monitored. In some embodiments, the interface resistance between the plated metal and the electrolyte in the plating solution is monitored using sensor 140.

In operation 314, the value of the interface resistance between the plated metal and the electrolyte in the plating solution is compared with the threshold resistance value. If the value of the interface resistance is above the threshold resistance value, the ECP process continues. On the other hand, if the value of the interface resistance is less than the threshold resistance value, the method 300 proceeds to operation 316, in which the concentration of the organic additives such as suppressors, accelerators, and levelers in the plating solution 230 are adjusted, for example, by the control system 170, to increase the interface resistance between the plated metal and the electrolyte and to reduce the metal deposition rate at the corners of the contact openings. As a result, void-free metal filling can be achieved across the entire substrate 202. The ECP system 100 of the present disclosure thus helps to improve the reliability of integrated circuits and to increase the manufacturing yield.

Figure 4:
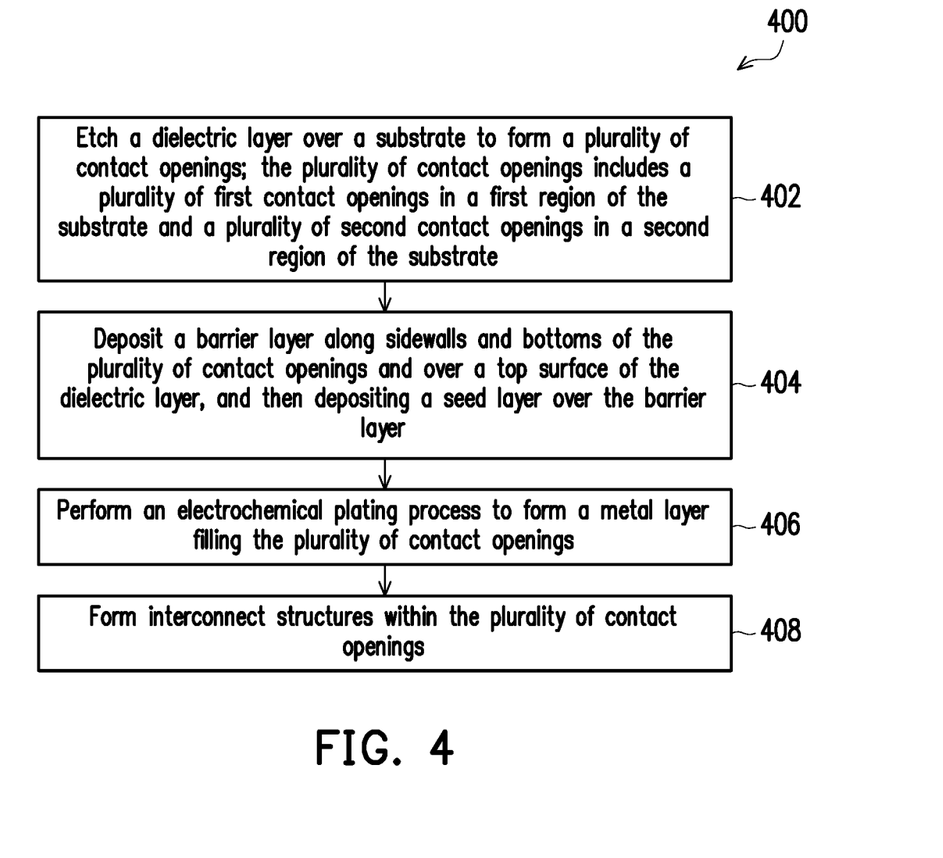
FIG. 4 is a flowchart of a method for fabricating a semiconductor structure, in accordance with some embodiments.

FIG. 4 is a flowchart of a method 400 for fabricating a semiconductor structure 500, in accordance with some embodiments. FIG. 5A-5D are cross-sectional views of the semiconductor structure 500 in various stages of the method 400, in accordance with some embodiments. The method 400 is discussed in detail below, with reference to the semiconductor structure, in FIGS. 5A-5D. In some embodiments, additional operations are performed before, during, and/or after the method 400, or some of the operations described are replaced and/or eliminated. In some embodiments, additional features are added to the semiconductor structure 500. In some embodiments, some of the features described below are replaced or eliminated. One of ordinary skill in the art would understand that although some embodiments are discussed with operations performed in a particular order, these operations may be performed in another logical order.

Figure 5A:
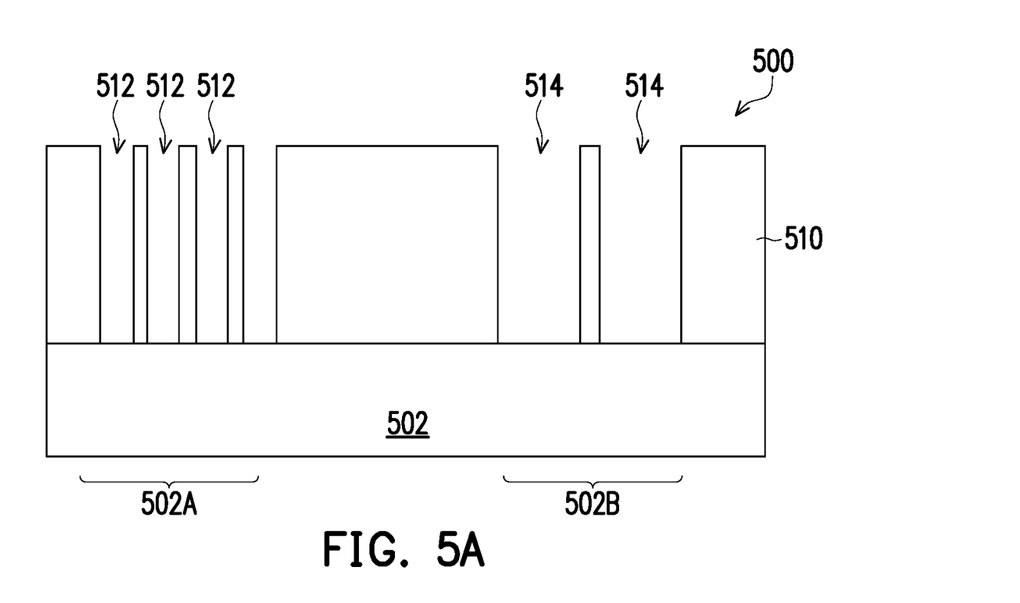
FIGS. 5A-5D are cross-sectional views of a semiconductor structure during various stages of the fabrication process.

Referring to FIG. 4 and FIG. 5A, the method 400 includes operation 402, in which a dielectric layer 510 over a substrate 502 is etched to form a plurality of contact openings 512, 514. FIG. 5A is a cross-sectional view of a semiconductor structure 500 after etching the dielectric layer 510 over the substrate 502 to form the plurality of contact openings 512, 514.

The substrate 502 is first provided. In some embodiments, the substrate 502 is a bulk semiconductor substrate including silicon. Alternatively or additionally, in some embodiments the bulk semiconductor substrate includes another elementary semiconductor such as germanium, a compound semiconductor including gallium arsenide, gallium, phosphide, indium phosphide, indium arsenide, and/or indium antimonide, an alloy semiconductor including SiGe, GaAsP, AlInAs, AlGaAs, GaInAs, GaInP, and/or GaInAsP; or combinations thereof. In some embodiments, the substrate 502 includes an epitaxial layer. For example, the substrate 502 has an epitaxial layer overlying a bulk semiconductor substrate. Furthermore, in some embodiments, the substrate 502 is a semiconductor on insulator (SOI) substrate. For example, the substrate 502 includes a buried oxide (BOX) layer formed by a process such as separation by implanted oxygen (SIMOX) or other suitable techniques, such as wafer bonding and grinding.

In some embodiments, the substrate 502 further includes active devices such as p-type field effect transistors (PFET), n-type field effect transistors (NFET), metal-oxide semiconductor (MOS) transistors, complementary metal-oxide semiconductor (CMOS) transistors, bipolar transistors, high voltage transistors, and/or high frequency transistors. In some embodiments, the transistors are planar transistors or three-dimensional fin-type transistors. In some embodiments, the substrate 502 further includes passive devices such as resistors, capacitors, and/or inductors. The substrate 502 further includes isolation structures such as shallow trench isolation (STI) structures to separate various active and/or passive devices from one another. For convenience, any such circuit elements are not shown in FIG. 5A.

The dielectric layer 510 is deposited over the substrate 502. In some embodiments and as in FIG. 5A, the dielectric layer 510 is deposited directly above and in contact with the substrate 502. In some embodiments, one or more dielectric layers containing contact/interconnect structures therein are disposed between the dielectric layer 510 and the substrate 502.

In some embodiments, the dielectric layer 510 includes silicon oxide. In some embodiments, the dielectric layer 510 includes a low-k dielectric material having a dielectric constant (k) less than 4. In some embodiments, the low-k dielectric material has a dielectric constant from about 1.2 to about 3.5. In some embodiments, the dielectric layer 510 includes tetraethylorthosilicate (TEOS) oxide, undoped silicate glass, or doped silicate glass such as borophosphosilicate glass (BPSG), fluorosilica glass (FSG), phosphosilicate glass (PSG), boron doped silicon glass (BSG), and/or other suitable dielectric materials. In some embodiments, the dielectric layer 510 is deposited by chemical vapor deposition (CVD), plasma enhanced chemical vapor deposition (PECVD), physical vapor deposition (PVD), or spin coating. In some embodiments, the dielectric layer 510 is planarized by a planarization process or otherwise recessed to provide a planar top surface. In some embodiments, the top surface of the dielectric layer 510 is planarized using a CMP process.

The dielectric layer 510 is subsequently etched to form the plurality of contact openings 512, 514 therein. In some embodiments, the contact openings 512, 514 are trenches or combinations of a trench and a via. A plurality of first contact openings 512 is formed in a first region 502A of the substrate 502 and a plurality of second contact openings 514 is formed in a second region 502B of the substrate 502. Due to difference in packing density of circuit elements in the substrate 502, the first contact openings 512 in the first region 502A of the substrate 502 are formed to have a higher density with a higher line-end density, for instance, due to a required higher number of electrical connections in the first region 502A, while the second contact openings 514 in the second region 502B are formed to have a lower density with a lower line-end density, for instance, due to a required lower number of electrical connections in the second region 502B.

The dielectric layer 510 is etched with lithography and etching processes. In some embodiments, the lithography process includes applying a photoresist layer (not shown) over the dielectric layer 510, exposing the photoresist layer to a pattern, performing post-exposure baking, and developing the resist to form a patterned photoresist layer (not shown). The patterned photoresist layer exposes portions of the dielectric layer 510 where the contact openings 512, 514 are to be formed. Next, the portions of the dielectric layer 510 exposed by the patterned photoresist layer are etched to form the contact openings 512, 514. In some embodiments, the dielectric layer 510 is etched using a dry etch such as, for example, a reactive ion etch (RIE) or a plasma etch. In some embodiments, the dielectric layer 510 is etched using a wet etch. After formation of the contact openings 512, 514 in the dielectric layer 510, the patterned photoresist layer is removed, for example, by wet stripping or plasma ashing. Alternatively, in some embodiments, a hard mask is used such that the contact opening pattern is transferred from the pattered photoresist layer to the hard mask by a first etch and then transferred to the dielectric layer 510 by a second etch.

Figure 5B:
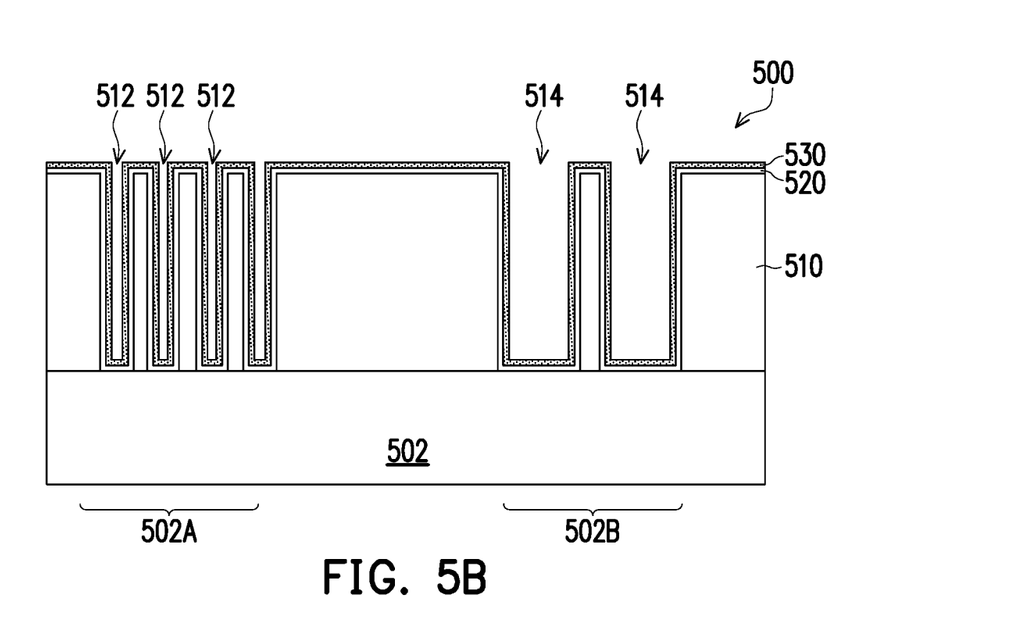

Referring to FIGS. 4 and 5B, the method 400 proceeds to operation 404, in which a barrier layer 520 is deposited along sidewalls and bottoms of the contact openings 512, 512 and over a top surface of the dielectric layer 510, followed by depositing a seed layer 530 over the barrier layer 520. FIG. 5B is a cross-sectional view of the semiconductor structure of FIG. 5A after depositing the barrier layer 520 along sidewalls and bottoms of the contact openings 512, 514 and over the top surface of the dielectric layer 510 and depositing the seed layer 530 over the barrier layer 520.

The barrier layer 520 is deposited over exposed surfaces of the contact openings 512, 514 and the dielectric layer 510. The barrier layer 520 is adapted to prevent diffusion of the metal filled in the contact openings 512, 514 to the dielectric layer 510. The barrier layer 520 also acts to improve the adhesion of the metal to the dielectric layer 510. In some embodiments, the barrier layer 520 includes a refractory metal such as titanium (Ti), tantalum (Ta), or ruthenium (Ru), a metal nitride such as titanium nitride (TiN) or tantalum nitride (TiN), or a bi-layer of the two such as Ti/TiN or Ta/TaN. In some embodiments, the barrier layer 520 is deposited utilizing a conformal deposition process such as CVD, PECVD, PVD, or atomic layer deposition (ALD).

The seed layer 530 is then deposited over the barrier layer 520. In some embodiments, the seed layer 530 includes the same metal used for the metallization fill in order to facilitate the deposition and bonding of the fill metal onto the barrier layer. In some embodiments, the seed layer 530 includes copper for copper metallization. In some embodiments, the seed layer 530 is deposited using a conformal deposition process such as PVD or ALD.

Figure 5C:
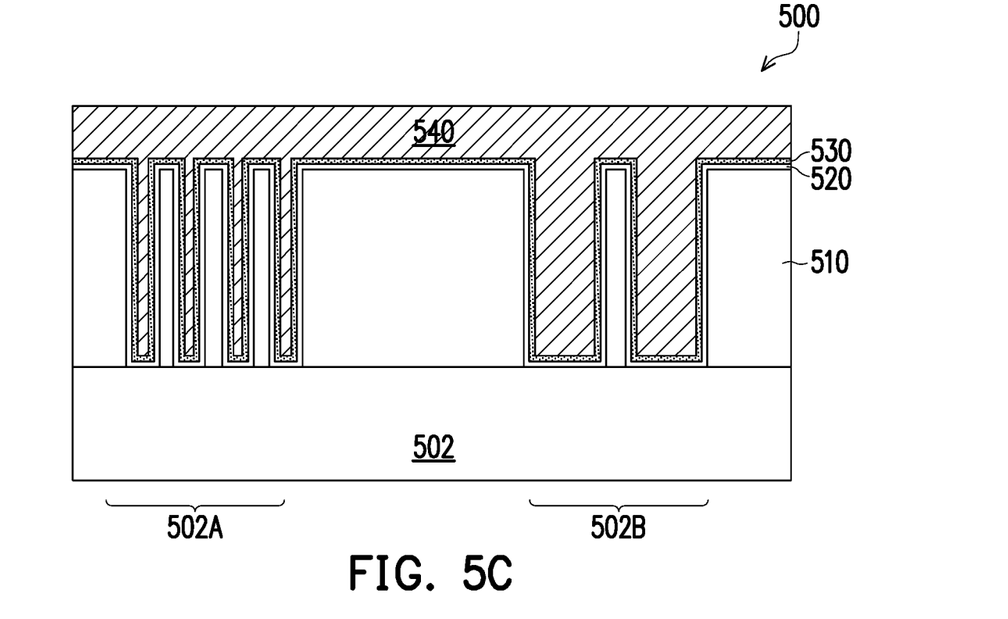

Referring to FIGS. 4 and 5C, the method 400 proceeds to operation 406, in which an ECP process is performed to form a metal layer 540, filling the contact openings 512, 514. FIG. 5C is a cross-sectional view of the semiconductor structure 500 of FIG. 5B after performing the ECP process to form the metal layer 540, filling the contact openings 512, 514.

In some embodiments, the ECP system 100 (FIGS. 1 and 2) is employed for electrochemically plating the substrate 502 so as to form the metal layer 540. During the ECP process, the interface resistance between the plated metal and the electrolyte in the plating solution is monitored by the sensor 140 (FIGS. 1 and 2) and the concentration of the organic additives in the plating solution 230 is adjusted to ensure that the ECP process forms a substantially void-free metal layer 540 within both the first contact openings 512 and second contact openings 514. In some embodiments, the metal layer 540 includes copper. In instances wherein the metal layer 540 and the seed layer 530 are composed of a same metal, the boundary between the metal layer 540 and the seed layer 530 is not discernible. It will be understood that although copper is referenced as an example when describing the various embodiments, the plating process described herein is able to be utilized with other metals including, but not limited to, gold (Au), silver (Ag), nickel (Ni), iron (Fe), palladium (Pd), and alloys plating thereof.

Figure 5D:
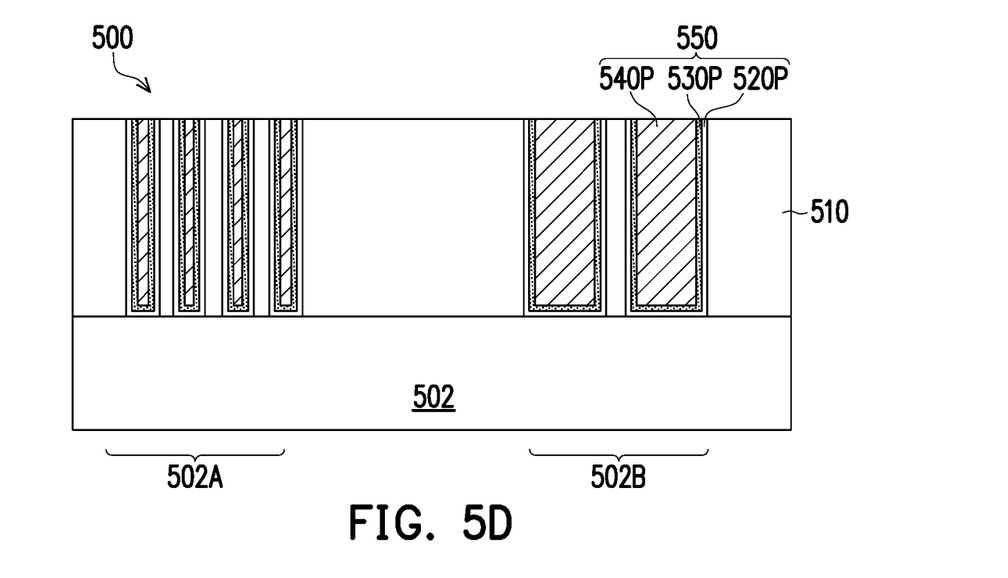

Referring to FIGS. 4 and 5D, the method 400 proceeds to operation 408, in which interconnect structures 550 are formed within the contact openings 512, 514. FIG. 5D is a cross-sectional view of the semiconductor structure 500 of FIG. 5C after forming the interconnect structures 550 within the contact openings 512, 514.

Each of the interconnect structures 550 includes a barrier layer portion 520P lining the sidewalls and bottom of a corresponding contact opening 512, 514, a seed layer portion 530P over the barrier layer portion 520P, and a metal layer portion 540P over the seed layer portion 530P. The interconnect structures 550 are formed by removing portions of the metal layer 540, the seed layer 530 and the barrier layer 520 that are located above the top surface of the dielectric layer 510. In some embodiments, a planarization process such as, for example, CMP is performed to remove portions of the metal layer 540, the seed layer 530 and the barrier layer 520 from the top surface of the dielectric layer 510. After planarization, remaining portions of the barrier layer 520 within the contact openings 512, 514 constitute the barrier layer portions 520P, remaining portions of the seed layer 530 within the contact openings 512, 514 constitute the seed layer portions 530P, and remaining portions of the metal layer 540 within the contact openings 512, 514 constitute the metal layer portions 540P. The barrier layer portions 520P, the seed layer portions 530P, and the metal layer portions 540P have top surfaces coplanar with the top surface of the dielectric layer 510.

Figure 6:
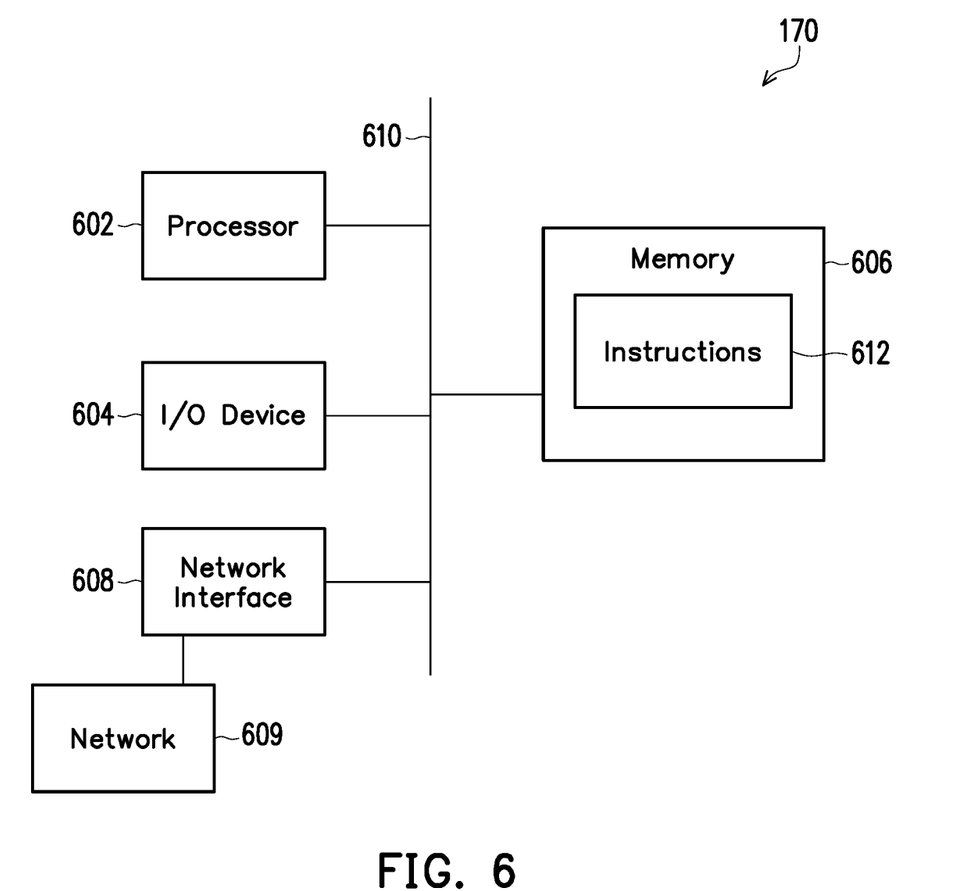
FIG. 6 is a diagram of a control system for controlling operation of an ECP system, in accordance with some embodiments.

FIG. 6 is a block diagram of a control system 170 for controlling operation of an ECP system 100, in accordance with some embodiments. The control system 170 generates output control signals for controlling operation of one or more components of the ECP system 100, in accordance with some embodiments. The control system 170 receives input signals from one or more components of the ECP system 100, in accordance with some embodiments. The control system 170 also compares the value of the interface resistance at the interface between the plated metal and the electrolyte in the plating solution with a threshold resistance value, and adjusts the composition of the plating solution 230 once the value of interface resistance is below the threshold resistance value. In some embodiments, the control system 170 is located adjacent the ECP system 100. In some embodiments, the control system 170 is remote from the ECP system 100.

The control system 170 includes a processor 602, an input/output (I/O) device 604, a memory 606, and a network interface 608, each communicatively coupled via a bus 610 or other interconnection communication mechanism.

The processor 602 is arranged to execute and/or interpret one or more sets of instructions 612 stored in the memory 606. In some embodiments, the processor 602 is a central processing unit (CPU), a multi-processor, a distributed processing system, an application specific integrated circuit (ASIC), and/or a suitable processing unit.

The I/O interface 604 is coupled to external circuitry. In some embodiments, the I/O interface 604 includes a keyboard, keypad, mouse, trackball, trackpad, and/or cursor direction keys for communicating information and commands to the processor 602.

The memory 606 (also referred to as a computer-readable medium) includes a random access memory or other dynamic storage device, communicatively coupled to the bus 610 for storing data and/or instructions for execution by the processor 602. In some embodiments, the memory 606 is used for storing temporary variables or other intermediate information during execution of instructions to be executed by the processor 602. In some embodiments, the memory 606 also includes a read-only memory or other static storage device coupled to the bus 610 for storing static information and instructions for the processor 602. In some embodiments, the memory 606 is an electronic, magnetic, optical, electromagnetic, infrared, and/or a semiconductor system (or apparatus or device). For example, the memory 606 includes a semiconductor or solid-state memory, a magnetic tape, a removable computer diskette, a random access memory (RAM), a read-only memory (ROM), a rigid magnetic disk, and/or an optical disk. In some embodiments using optical disks, the memory 606 includes a compact disk-read only memory (CD-ROM), a compact disk-read/write (CD-R/W), and/or a digital video disc (DVD).

The memory 606 is encoded with, i.e., storing, the computer program code, i.e., a set of executable instructions 612, for controlling one or more components of the ECP system 100 and causing the control system 170 to perform the ECP process. In some embodiments, the memory 606 also stores information needed for performing the ECP process as well as information generated during performing the ECP process. In some embodiments, the memory 606 stores the threshold resistance value as well as the resistance data of the plating solution 230 generated during performing the ECP process.

The network interface 608 includes a mechanism for connecting to a network 609, to which one or more other computer systems are connected. In some embodiments, the network interface 608 includes a wired and/or wireless connection mechanism. The network interface 608 includes wireless network interfaces such as BLUETOOTH, WIFI, WIMAX, GPRS, or WCDMA; or wired network interface such as ETHERNET, USB, or IEEE-1394. In some embodiments, the control system 170 is coupled with one or more components of the ECP system 100 via the network interface 608. In some embodiments, the control system 170 is directly coupled with one or more components of the ECP system 100, e.g., with the components coupled to the bus 610 instead of via the network interface 608.

One aspect of this description relates to an electrochemical plating (ECP) system. The ECP system includes an ECP cell comprising a plating solution for an ECP process, a sensor configured to in situ measure an interface resistance between a plated metal and an electrolyte in the plating solution as the ECP process continues, a plating solution supply system in fluid communication with the ECP cell and configured to supply the plating solution to the ECP cell, and a control system operably coupled to the ECP cell, the sensor and the plating solution supply system. The control system is configured to compare the interface resistance with a threshold resistance, and to adjust a composition of the plating solution in response to the interface resistance being below the threshold resistance. In some embodiments, the sensor includes an ohmmeter or an impedance meter. In some embodiments, the sensor includes a probe adapted to be partially immersed in the plating solution. In some embodiments, the probe includes wires composed of copper or copper plated over a noble metal. In some embodiments, the noble metal includes platinum, gold, palladium, iridium, or ruthenium. In some embodiments, the plating solution includes a metal salt and organic additives. The control system is configured to adjust an amount of at least one of the organic additives in the plating solution. In some embodiments, the ECP system further includes one or more spin rinse dry cells and one or more substrate bevel cleaning cells. In some embodiments, the ECP system further includes a factory interface including a plurality of substrate loading stations. In some embodiments, the ECP system further includes an anneal chamber.

Another aspect of this description relates to a method for performing an electrochemical plating (ECP) process. The method includes contacting a surface of a substrate with a plating solution comprising ions of a metal to be deposited. The method further includes electroplating the metal on the surface of the substrate. The method further includes in situ monitoring an interface resistance between the electroplated metal and an electrolyte in the plating solution as the ECP process continues. The method further includes adjusting a composition of the plating solution in response to the interface resistance being below a threshold resistance that is associated with a subset of conductive lines having a highest line-end density among a plurality of conductive lines for a metallization layer over the substrate. In some embodiments, adjusting the composition of the plating solution includes adjusting an amount of at least one organic additive in the plating solution. In some embodiments, the method further includes receiving a layout data of an integrated circuit to be manufactured on the substrate. In some embodiments, the method further includes calculating line-end densities of the plurality of conductive lines in a plurality of unit grid areas in the substrate based on the layout data. In some embodiments, the method further includes identifying the subset of conductive lines having the highest line-end density in a unit grid area of the plurality of unit grid areas. In some embodiments, the method further includes determining the threshold resistance based on empirical data.

Still another aspect of this description relates to a method of forming a semiconductor structure. The method includes forming a plurality of contact openings in a dielectric layer over a substrate. The plurality of contact openings includes a plurality of first contact openings in a first region of the substrate and a plurality of second contact openings in a second region of the substrate. The plurality of first contact openings having a highest line-end density in the plurality of contact openings. The method further includes forming a barrier layer along sidewalls and bottoms of the plurality of contact openings and over the dielectric layer. The method further includes forming a seed layer over the barrier layer. The method further includes performing an electrochemical plating (ECP) process to fill the plurality of contact openings with a conductive layer. Performing the ECP process includes in situ monitoring an interface resistance of an electroplated metal and an electrolyte in a plating solution as the ECP process proceeds, and adjusting a composition of the plating solution in response to the interface resistance being below a threshold resistance that is associated with the highest line-end density. In some embodiments, forming the plurality of contact openings in the dielectric layer includes etching the dielectric layer using an anisotropic etch. In some embodiments, the method further includes removing portions of the conductive layer, the seed layer and the barrier layer from a top surface of the dielectric layer. In some embodiments, performing the ECP process further includes applying a bias between the substrate and an anode positioned in the plating solution. In some embodiments, performing the ECP process further includes comparing the interface resistance with the threshold resistance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for performing an electrochemical plating (ECP) process, comprising:
    contacting a surface of a substrate with a plating solution comprising ions of a metal to be deposited;
    electroplating the metal on the surface of the substrate;
    in situ monitoring an interface resistance between the electroplated metal and an electrolyte in the plating solution as the ECP process continues; and
    adjusting a composition of the plating solution in response to the interface resistance being below a threshold resistance that is associated with a subset of conductive lines having a highest line-end density among a plurality of conductive lines for a metallization layer over the substrate.

2. The method of claim 1, wherein adjusting the composition of the plating solution comprises adjusting an amount of at least one organic additive in the plating solution.

3. The method of claim 1, further comprising receiving a layout data of an integrated circuit to be manufactured on the substrate.

4. The method of claim 3, further comprising calculating line-end densities of the plurality of conductive lines in a plurality of unit grid areas in the substrate based on the layout data.

5. The method of claim 4, further comprising identifying the subset of conductive lines having the highest line-end density in a unit grid area of the plurality of unit grid areas.

6. The method of claim 5, further comprising determining the threshold resistance based on empirical data.

7. A method of forming a semiconductor structure, comprising:
    forming a plurality of contact openings in a dielectric layer over a substrate, the plurality of contact openings comprising a plurality of first contact openings in a first region of the substrate and a plurality of second contact openings in a second region of the substrate, the plurality of first contact openings having a highest line-end density in the plurality of contact openings;
    forming a barrier layer along sidewalls and bottoms of the plurality of contact openings and over the dielectric layer;
    forming a seed layer over the barrier layer; and
    performing an electrochemical plating (ECP) process to fill the plurality of contact openings with a conductive layer, wherein performing the ECP process comprises:
        in situ monitoring an interface resistance between an electroplated metal and an electrolyte in a plating solution as the ECP process continues; and adjusting a composition of the plating solution in response to the interface resistance being below a threshold resistance that is associated with the highest line-end density.

8. The method of claim 7, wherein forming the plurality of contact openings in the dielectric layer comprises etching the dielectric layer using an anisotropic etch.

9. The method of claim 7, further comprising removing portions of the conductive layer, the seed layer and the barrier layer from a top surface of the dielectric layer.

10. The method of claim 7, wherein performing the ECP process further comprises applying a bias between the substrate and an anode positioned in the plating solution.

11. The method of claim 7, wherein performing the ECP process further comprises comparing the interface resistance with the threshold resistance.

12. The method of claim 1, further comprising determining the threshold resistance using a layout data of an integrated circuit.

13. The method of claim 12, wherein determining the threshold resistance comprises:
 extracting a subset of the layout data corresponding to a plurality of conductive lines for a metallization layer from the layout data of the integrated circuit;
 dividing the substrate into a plurality of unit grid areas;
 calculating a line-end density of the plurality of conductive lines for each unit grid area of the plurality of unit grid areas;
 identifying a subset of conductive lines in a unit grid area of the plurality of unit grid areas having the highest line-end density; and
 determining the threshold resistance below which voids are formed in the conductive lines having the highest line-end density.

14. The method of claim 1, wherein adjusting the composition of the plating solution comprises increasing an amount of at least one organic additive in the plating solution.

15. A method of forming a semiconductor structure, comprising:
 depositing a dielectric layer on a substrate;
 etching the dielectric layer to form a plurality of contact openings having different line-end densities in the dielectric layer, a plurality of first contact openings in the plurality of contact openings having the highest line-end density;
 forming a seed layer along surfaces of the plurality of contact openings;
 contacting the seed layer with a plating solution comprising a salt of a metal, an organic additive and an electrolyte;
 depositing the metal onto the seed layer by electroplating;
 in situ measuring an interface resistance between the electroplated metal and the electrolyte as the metal being deposited; and
 increasing a concentration of the organic additive in response to the interface resistance being below a threshold resistance below which voids are formed in the plurality of first contact openings, wherein the threshold resistance is determined using a layout data of an integrated circuit.

16. The method of claim 15, wherein the organic additive comprises a suppressor, an accelerator, a leveler, or combinations thereof.

17. The method of claim 15, wherein determining the threshold resistance comprises:
 extracting a subset of the layout data corresponding to a plurality of conductive lines for a metallization layer from the layout data of the integrated circuit;
 dividing the substrate into a plurality of unit grid areas;
 calculating a line-end density of the plurality of conductive lines for each unit grid area of the plurality of unit grid areas;
 identifying a subset of conductive lines in a unit grid area of the plurality of unit grid areas having the highest line-end density, wherein the subset of conductive lines correspond to the first contact openings; and
 determining the threshold resistance based on empirical data.

18. The method of claim 15, further comprising comparing the in situ measured interface resistance with the threshold resistance prior to increasing the concentration of the organic additive.

19. The method of claim 15, wherein the interface resistance is monitored using a sensor.

20. The method of claim 19, wherein the sensor is an ohmmeter or an impedance meter.

\* \* \* \* \*